US008592886B2

(12) United States Patent
Hsu et al.

(10) Patent No.: US 8,592,886 B2
(45) Date of Patent: Nov. 26, 2013

(54) ERASABLE PROGRAMMABLE SINGLE-PLOY NONVOLATILE MEMORY

(75) Inventors: Te-Hsun Hsu, Hsinchu County (TW); Hsin-Ming Chen, Hsinchu (TW); Ching-Sung Yang, Hsinchu (TW); Wen-Hao Ching, Hsinchu County (TW); Wei-Ren Chen, Pingtung County (TW)

(73) Assignee: Ememory Technology Inc., Hsin-Chu (TW)

( * ) Notice: Subject to any disclaimer, the term of this patent is extended or adjusted under 35 U.S.C. 154(b) by 0 days.

(21) Appl. No.: 13/572,731

(22) Filed: Aug. 13, 2012

(65) Prior Publication Data

US 2013/0234228 A1    Sep. 12, 2013

Related U.S. Application Data (63) Continuation-in-part of application No. 13/415,185, filed on Mar. 8, 2012.

(60) Provisional application No. 61/608,119, filed on Mar. 8, 2012.

(51) Int. Cl.
 *H01L 29/788* (2006.01)
 *H01L 29/06* (2006.01)

(52) U.S. Cl.
 USPC .......................................... 257/315; 257/321

(58) Field of Classification Search
 None
 See application file for complete search history.

(56) References Cited

U.S. PATENT DOCUMENTS

| 5,736,764 | A | 4/1998 | Chang |
| 5,761,121 | A | 6/1998 | Chang |
| 5,841,165 | A | 11/1998 | Chang et al. |
| 6,166,954 | A | 12/2000 | Chern |
| 6,678,190 | B2 | 1/2004 | Yang et al. |
| 7,078,761 | B2 | 7/2006 | Wang et al. |
| 2004/0065917 | A1* | 4/2004 | Fan et al. ........................ 257/315 |
| 2005/0199936 | A1 | 9/2005 | Wang et al. |

OTHER PUBLICATIONS

Paola Vega-Castillo and Wolfgang H. Krautschneider "Single poly PMOS-based CMOS-compatible low voltage OTP", Proc. SPIE 5837, VLSI Circuits and Systems II, 953 (Jun. 30, 2005).*
Lin, C., and C. Sun. "A Single-poly EEPROM Cell Structure Compatible to Standard CMOS Process." Solid-State Electronics 51.6 (2007): 888-93.*
A. Di Bartolomeo, H. Rücker, P. Schley, A. Fox, S. Lischke, Kee-Yeol Na, A single-poly EEPROM cell for embedded memory applications, Solid-State Electronics, vol. 53, Issue 6, Jun. 2009, pp. 644-648, ISSN 0038-1101, 10.1016/j.sse.2009.04.007.*

\* cited by examiner

*Primary Examiner* — Thomas L Dickey
*Assistant Examiner* — Joseph Schoenholtz
(74) *Attorney, Agent, or Firm* — WPAT, PC; Justin King (57) ABSTRACT

An erasable programmable single-poly nonvolatile memory includes a floating gate transistor having a floating gate, a gate oxide layer under the floating gate, and a channel region; and an erase gate region, wherein the floating gate is extended to and is adjacent to the erase gate region. The gate oxide layer comprises a first portion above the channel region of the floating gate transistor and a second portion above the erase gate region, and a thickness of the first portion of the gate oxide layer is different from a thickness of the second portion of the gate oxide layer.

26 Claims, 8 Drawing Sheets

ERASABLE PROGRAMMABLE SINGLE-PLOY NONVOLATILE MEMORY

This is a continuation-in-part application of U.S. application Ser. No. 13/415,185, filed Mar. 8, 2012. The application claims the benefit of U.S. provisional application Ser. No. 61/608,119, filed Mar. 8, 2012, the subject matter of which is incorporated herein by reference.

FIELD OF THE INVENTION

The present invention relates to a nonvolatile memory, and more particularly to an erasable programmable single-poly nonvolatile memory.

BACKGROUND OF THE INVENTION

Figure 1:
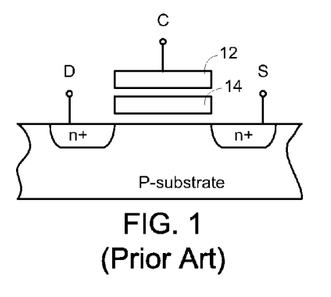
FIG. 1 (prior art) is a schematic cross-sectional view illustrating a conventional programmable dual-poly nonvolatile memory.

FIG. 1 is a schematic cross-sectional view illustrating a conventional programmable dual-poly nonvolatile memory. The programmable dual-poly nonvolatile memory is also referred as a floating-gate transistor. As shown in FIG. 1, this nonvolatile memory comprises two stacked and separated gates. The upper gate is a control gate 12, which is connected to a control line C. The lower gate is a floating gate 14. In addition, an n-type doped source region and an n-type doped drain region are constructed in a P-substrate. The n-type doped source region is connected to a source line S. The n-type doped drain region is connected to a drain line D.

In a case that the nonvolatile memory is in a programmed state, a high voltage (e.g. +16V) is provided by the drain line D, a ground voltage is provided by the source line S, and a control voltage (e.g. +25V) is provided by the control line C. Consequently, during the electrons are transmitted from the source line S to the drain line D through an n-channel region, the hot carriers (e.g. hot electrons) are attracted by the control voltage on the control gate 12 and injected into the floating gate 14. Under this circumstance, a great number of carriers are accumulated in the floating gate 14. Consequently, the programmed state may be considered as a first storage state (e.g. "0").

In a case that the nonvolatile memory is in a non-programmed state, no carrier is injected into the floating gate 14, and thus the non-programmed state may be considered as a second storage state (e.g. "1").

In other words, the characteristic curves of the drain current (id) and the gate-source voltage (Vgs) (i.e. an id-Vgs characteristic curve) in the first storage state and the id-Vgs characteristic curve in the second storage state are distinguished. Consequently, the storage state of the floating-gate transistor may be realized according to the variation of the id-Vgs characteristic curve.

However, since the floating gate 14 and the control gate 12 of the programmable dual-poly nonvolatile memory should be separately produced, the process of fabricating the programmable dual-poly nonvolatile memory needs more steps and is incompatible with the standard CMOS manufacturing process.

Figures 2A, 2B:
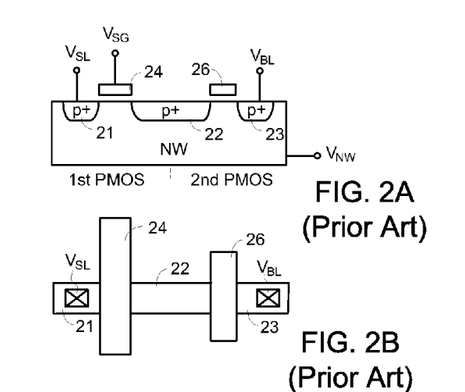
FIG. 2A (prior art) is a schematic cross-sectional view illustrating a conventional programmable single-poly nonvolatile memory disclosed in U.S. Pat. No. 6,678,190.
FIG. 2B (prior art) is a schematic top view illustrating the conventional programmable single-poly nonvolatile memory of FIG. 2A.
Figure 2C:
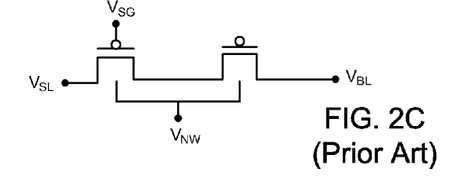
FIG. 2C (prior art) is a schematic circuit diagram illustrating the conventional programmable single-poly nonvolatile memory of FIG. 2A.

U.S. Pat. No. 6,678,190 discloses a programmable single-poly nonvolatile memory. FIG. 2A is a schematic cross-sectional view illustrating a conventional programmable single-poly nonvolatile memory disclosed in U.S. Pat. No. 6,678, 190. FIG. 2B is a schematic top view illustrating the conventional programmable single-poly nonvolatile memory of FIG. 2A. FIG. 2C is a schematic circuit diagram illustrating the conventional programmable single-poly nonvolatile memory of FIG. 2A.

Please refer to FIGS. 2A-2C. The conventional programmable single-poly nonvolatile memory comprises two serially-connected p-type metal-oxide semiconductor (PMOS) transistors. The first PMOS transistor is used as a select transistor, and a select gate 24 of the first PMOS transistor is connected to a select gate voltage $V_{SG}$. A p-type doped source region 21 is connected to a source line voltage $V_{SL}$. Moreover, a p-type doped drain region 22 may be considered as a combination of a p-type doped drain region of the first PMOS transistor and a first p-type doped region of the second PMOS transistor. A floating gate 26 is disposed over the second PMOS transistor. A second p-type doped region 23 of the second PMOS transistor is connected to a bit line voltage $V_{BL}$. Moreover, these PMOS transistors are constructed in an N-well region (NW). The N-well region is connected to an N-well voltage $V_{NW}$. The second PMOS transistor is used as a floating gate transistor.

By properly controlling the select gate voltage $V_{SG}$, the source line voltage $V_{SL}$, the bit line voltage $V_{BL}$ and the N-well voltage $V_{NW}$, the conventional programmable single-poly nonvolatile memory may be operated in a programmed state or a read state.

Since the two PMOS transistors of the conventional programmable single-poly nonvolatile memory have respective gates 24 and 26, the process of fabricating the conventional programmable single-poly nonvolatile memory is compatible with the standard CMOS manufacturing process.

As described in FIGS. 1 and 2, the nonvolatile memory is programmable. The electrical property of the nonvolatile memory is only utilized to inject a great number of hot carriers to the floating gate. However, the electrical property fails to be utilized to remove the carriers from the floating gate. That is, for achieving the data-erasing function, the carriers stored in the floating gate may be removed from the floating gate by exposing ultraviolet (UV) light to the nonvolatile memory. These nonvolatile memories are named as one time programming (OTP) memories.

Therefore, for multi-times programming (MTP) memories design, there is a need of providing an erasable programmable single-poly nonvolatile memory.

SUMMARY OF THE INVENTION

The present invention provides an erasable programmable single-poly nonvolatile memory in order to obviate the drawbacks encountered from the prior art.

The present invention provides an erasable programmable single-poly nonvolatile memory, comprising: a floating gate transistor comprising a floating gate, a gate oxide layer under the floating gate, and a channel region; and an erase gate region, wherein the floating gate is extended to and is adjacent to the erase gate region; wherein the gate oxide layer comprises a first portion above the channel region of the floating gate transistor and a second portion above the erase gate region, and a thickness of the first portion of the gate oxide layer is different from a thickness of the second portion of the gate oxide layer.

The present invention provides an erasable programmable single-poly nonvolatile memory, comprising: a floating gate transistor comprising a floating gate, a gate oxide layer under the floating gate, and a channel region; an erase gate region; an assist gate region, wherein the floating gate is extended to and is adjacent to the erase gate region and the assist gate region; wherein the gate oxide layer comprises a first portion above the channel region of the floating gate transistor and a second portion above the erase gate region, and a thickness of the first portion of the gate oxide layer is different from a thickness of the second portion of the gate oxide layer.

The present invention provides an erasable programmable single-poly nonvolatile memory, comprising: a word line transistor; a floating gate transistor comprising a floating gate, a gate oxide layer under the floating gate, and a channel region; a select gate transistor, wherein the word line transistor, the floating gate transistor and the select gate transistor are serially connected; an erase gate region; an assist gate region, wherein the floating gate is extended to and is adjacent to the erase gate region and the assist gate region; wherein the gate oxide layer comprises a first portion above the channel region of the floating gate transistor and a second portion above the erase gate region, and a thickness of the first portion of the gate oxide layer is different from a thickness of the second portion of the gate oxide layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3A:
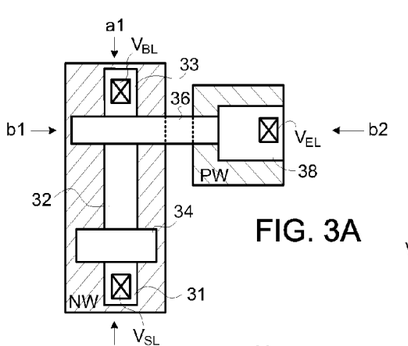
FIGS. 3A-3D schematically illustrate an erasable programmable single-poly nonvolatile memory according to a first embodiment of the present invention.
Figure 3B:
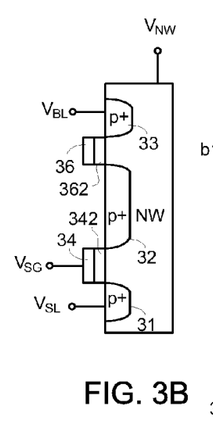
Figure 3C:
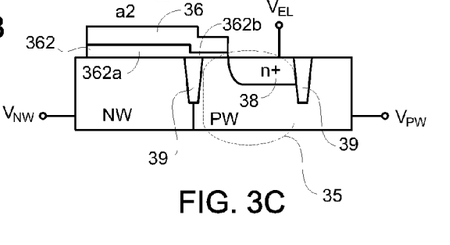
Figure 3D:
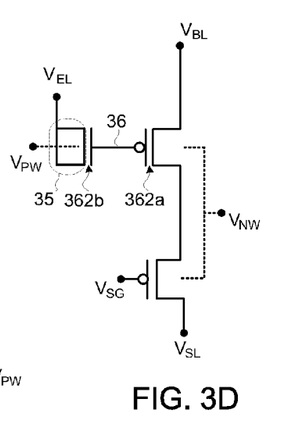

FIGS. 3A-3D schematically illustrate an erasable programmable single-poly nonvolatile memory according to a first embodiment of the present invention. FIG. 3A is a schematic top view illustrating the erasable programmable single-poly nonvolatile memory according to the first embodiment of the present invention. FIG. 3B is a schematic cross-sectional view illustrating the erasable programmable single-poly nonvolatile memory of FIG. 3A and taken along a first direction (a1-a2). FIG. 3C is a schematic cross-sectional view illustrating the erasable programmable single-poly nonvolatile memory of FIG. 3A and taken along a second direction (b1-b2). FIG. 3D is a schematic equivalent circuit diagram of the erasable programmable single-poly nonvolatile memory according to the first embodiment of the present invention. Furthermore, the nonvolatile memory of the present invention is manufactured by using a single poly process, which is compatible with a logical CMOS fabrication process.

As shown in FIGS. 3A and 3B, the erasable programmable single-poly nonvolatile memory of the first embodiment comprises two serially-connected p-type metal-oxide semiconductor (PMOS) transistors. These two PMOS transistors are constructed in an N-well region (NW). Three p-type doped regions 31, 32 and 33 are formed in the N-well region (NW). In addition, two polysilicon gates 34 and 36 are spanned over the areas between the three p-type doped regions 31, 32 and 33, and gate oxides layer 342 and 362 are formed between the two polysilicon gates 34 and 36 and a top surface of the semiconductor. Moreover, two polysilicon gates 34 and 36 above the N-well region (NW) are P-doped polysilicon gates 34 and 36.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the N-well region (NW) is connected to an N-well voltage $V_{NW}$. The second PMOS transistor is used as a floating gate transistor.

As shown in FIGS. 3A and 3C, the erasable programmable single-poly nonvolatile memory of the first embodiment comprises an n-type metal-oxide semiconductor (NMOS) transistor or a combination of the floating gate 36, gate oxide layer 362 and an erase gate region 35. The NMOS transistor is constructed in a P-well region (PW). An n-type doped region 38 is formed in the P-well region (PW). In other words, the erase gate region 35 includes the P-well region (PW) and the n-type doped regions 38. Furthermore, the floating gate 36 above the P-well region (PW) is an N-doped polysilicon gate. Also, the P-well region (PW) can be a P-doped well region and the N-well region can be an N-doped well region.

As shown in FIG. 3A, the floating gate 36 is extended to and is adjacent to the erase gate region 35. Moreover, the n-type doped region 38 may be considered as a combination of an n-type doped source region and an n-type doped drain region of the NMOS transistor and the floating gate 36 may be considered as a gate of the NMOS transistor. The n-type doped region 38 is connected to an erase line voltage $V_{EL}$. In addition, the P-well region (PW) is connected to a P-well voltage $V_{PW}$. As shown in FIG. 3C, the gate oxide layer 362 is formed under the floating gate 36, and the gate oxide layer 362 includes two portions 362a and 362b. The first portion 362a of the gate oxide layer 362 is formed in the floating gate transistor (second PMOS transistor) and the second portion 362b of the gate oxide layer 362 is formed in the NMOS transistor (or above the erase gate region 35). According to the first embodiment of the present invention, an etching back process is adopted to etch the second portion of the gate oxide layer. In this way, a thickness of the first portion 362a of the gate oxide layer 362 is thicker than a thickness of the second portion 362b of the gate oxide layer 362. Furthermore, an isolation structure 39 is formed between the P-well region (PW) and the N-well region (NW). For example, the isolation structure 39 is a shallow trench isolation (STI) structure.

As shown in FIG. 3D, the erase gate region 35 also can be seen as a tunneling capacitor for the storage carriers eject from the floating gate 36 to out of the nonvolatile memory through the tunneling capacitor.

Figure 4A:
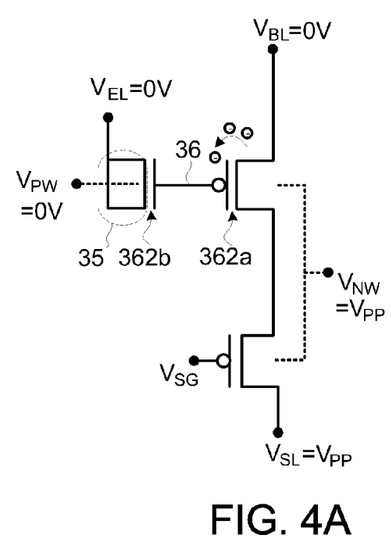
FIGS. 4A-4C schematically and respectively illustrate the bias voltages of the erasable programmable single-poly nonvolatile memory in a programmed state, an erased state and a read state according to the first embodiment of the present invention.
Figure 4B:
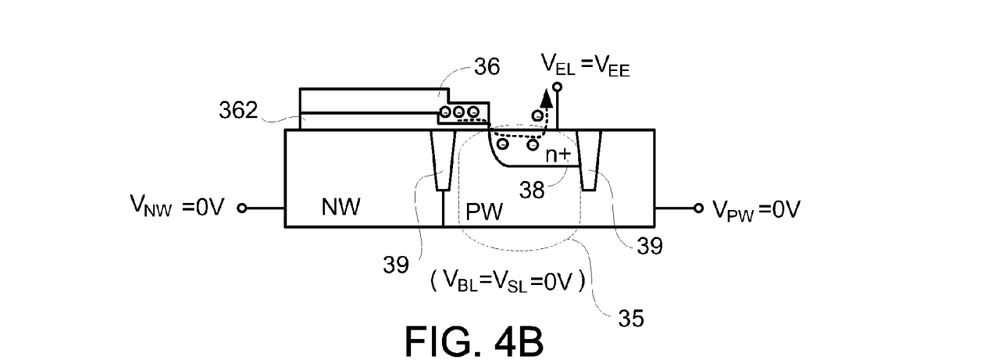
Figure 4C:
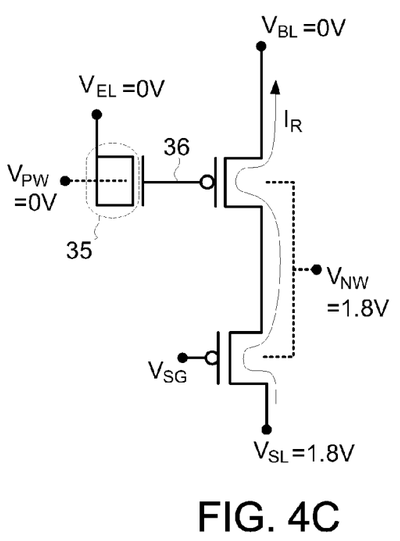

FIGS. 4A-4C schematically and respectively illustrate the bias voltages of the erasable programmable single-poly nonvolatile memory in a programmed state, an erased state and a read state according to the first embodiment of the present invention.

Please refer to FIG. 4A. In the programmed state, each of the bit line voltage $V_{BL}$, the erase line voltage $V_{EL}$ and the P-well voltage $V_{PW}$ is equal to a ground voltage (0V). Whereas, each of the N-well voltage $V_{NW}$ and the source line voltage $V_{SL}$ is equal to a first positive voltage $V_{pp}$. The first positive voltage $V_{pp}$ is in the range between +3.0V and +8.0V. In a case that the hot carriers (e.g. electrons) are transmitted through a channel region of the floating gate transistor corresponding to the floating gate 36, the first portion 362a of gate oxide layer 362 are tunneled by the hot electrons and then the hot electrons are injected into the floating gate 36. In other words, the injection of hot carriers is by a channel hot carrier effect. Obviously, according to the present invention, the control gate used in the conventional nonvolatile memory for controlling the injection of the hot carriers into the floating gate may be omitted. In addition, the operating principles of the nonvolatile memory of the present invention in the programmed state are similar to those of the conventional nonvolatile memory (see disclosed in U.S. Pat. No. 6,678,190), and are not redundantly described herein.

Please refer to FIG. 4B. In the erased state, each of the bit line voltage $V_{BL}$, the source line voltage $V_{SL}$, the N-well voltage $V_{NW}$ and the P-well voltage $V_{PW}$ is equal to the ground voltage (0V). Whereas, the erase line voltage $V_{EL}$ is equal to a second positive voltage $V_{EE}$. As shown in FIG. 4B, if the erase line voltage $V_{EL}$ is equal to the second positive voltage $V_{EE}$, the storage carriers (e.g. electrons) are removed from the floating gate 36. That is to say, the second portion 362b of gate oxide layer 362 are tunneled by the storage carriers and then the storage carriers in the floating gate 36 are discharged out of the nonvolatile memory through the n-type doped region 38. In other words, the ejection of the storage carriers can be by using Fowler-Nordheim (FN) effect to achieve. Consequently, after the erased state, no carrier is stored in the floating gate 36.

Please refer to FIG. 4C. In the read state, the bit line voltage $V_{BL}$ is equal to ground voltage (0V), the source line voltage $V_{SL}$ is equal to 1.8V, the N-well voltage $V_{NW}$ is equal to 1.8V, the erase line voltage $V_{EL}$ is equal to ground voltage (0V), and the P-well voltage $V_{PW}$ is equal to the ground voltage (0V). Depending on whether the hot carriers are stored in the floating gate 36, different magnitudes of the read current $I_R$ are acquired. That is, in the read state, the storage state of the nonvolatile memory may be realized according to the read current $I_R$. For example, in the first storage state (e.g. "0" state), the read current $I_R$ is higher than 5 µA. In the second storage state (e.g. "1" state), the read current $I_R$ is lower than 0.1 µA. Furthermore, the above mentioned bias voltages may be need not be limited to the fixed voltages. For example, the bit line voltage $V_{BL}$ can be in the range between 0V to 0.5V, the source line voltage $V_{SL}$ and the N-well voltage $V_{NW}$ can be in the range between $V_{DD}$ and $V_{DD2}$, and the erase line voltage $V_{EL}$ can be in the range between 0V and $V_{DD2}$, wherein the $V_{DD}$ is the core device voltage of the nonvolatile memory and the $V_{DD2}$ is 10 device voltage of the nonvolatile memory.

Figure 5:
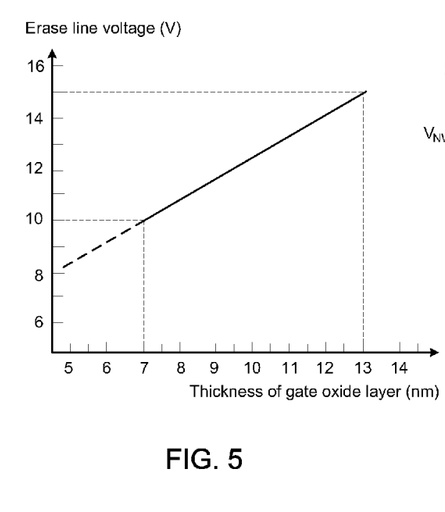
FIG. 5 is a plot illustrating the relation of the thickness of the gate oxide layer and the erase line voltage ($V_{EL}$)

FIG. 5 is a plot illustrating the relation of the thickness of the gate oxide layer and the erase line voltage ($V_{EL}$). In standard CMOS manufacturing process, original thickness of the gate oxide layer 362 is about 13 nm for 5V technology process and the erase line voltage ($V_{EL}$) is about 15V-16V to remove the storage carriers from the floating gate 36 for Fowler-Nordhiem (FN) erasing operation. However, the higher erase line voltage ($V_{EL}$) may result in junction breakdown in the erase gate region 35. According to the embodiment of the present invention, a portion (second portion 362b) of the gate oxide layer 362 is further etched to have a thinner thickness then the other portion (first portion 362a). That is to say, a thickness of the first portion 362a for the hot electrons injected into the floating gate 36 is thicker than a thickness of the second portion 362b for storage carriers ejected from the gate oxide 36.

FIGS. 6A-6D schematically illustrate another two erase gate regions capable of replacing the erase gate region 35 shown in the first embodiment. The structure of the first PMOS transistor (select transistor) and the second PMOS transistor (floating gate transistor) are the same with FIG. 3B, and are not redundantly shown herein.

Figure 6A:
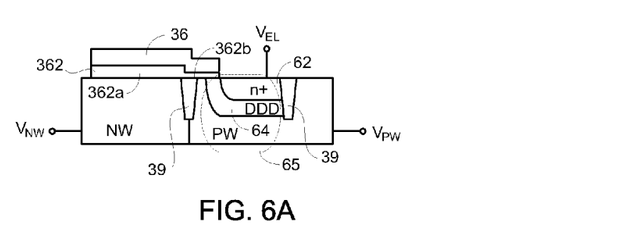
FIGS. 6A-6D schematically illustrate another two erase gate regions capable of replacing the erase gate region shown in the first embodiment.
Figure 6B:
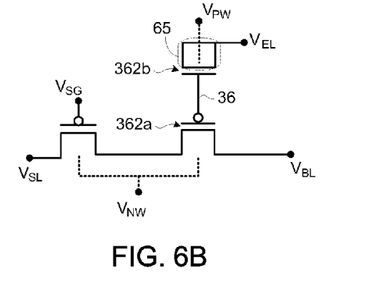

As shown in FIGS. 6A and 6B, there is a double diffused drain (DDD) region 64 formed between the n-type doped regions 62 and the P-well region (PW) in the erase gate region 65 comparing with FIG. 3C. To achieving a lower erase line voltage ($V_{EL}$), a thickness of the second portion 362b of the gate oxide layer 362 is thinner than a thickness of the first portion 362a of the gate oxide 362.

FIG. 6B shows the equivalent circuit diagram of the erasable programmable single-poly nonvolatile memory including the first PMOS transistor, the second PMOS transistor, and the erase gate region 65.

Figure 6C:
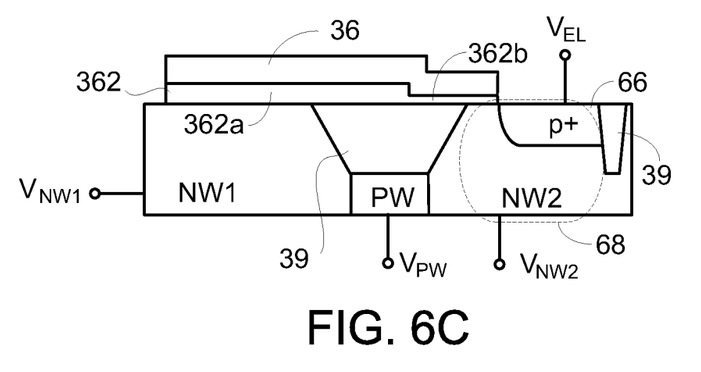
Figure 6D:
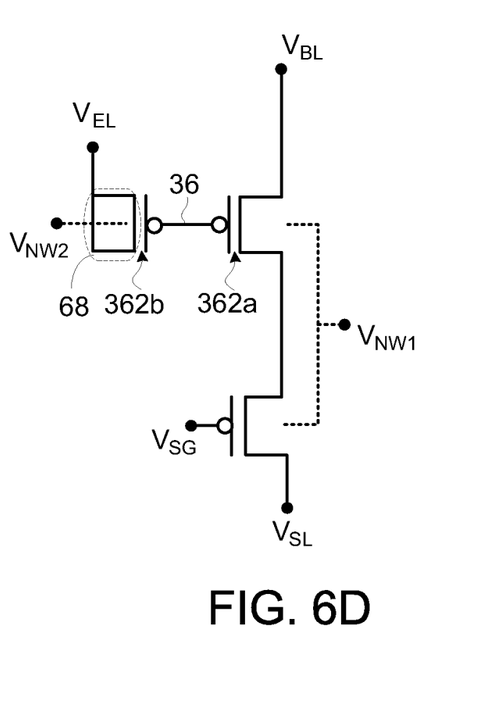

As shown in FIGS. 6C and 6D, an additional PMOS transistor constructed in a second N-well region (NW2). The PMOS transistor also can be seen as a combination of the floating gate 36, gate oxide layer 362 and an erase gate region 68. In other words, the erase gate region 68 includes the second N-well region (NW2), and a p-type doped region 66. As shown in FIG. 6C, the p-type doped region 66 is formed in the second N-well region (NW2). Moreover, as shown in FIG. 6C, the first N-well region (NW1) and the second N-well region (NW2) are completely isolated from each other by an isolation structure 39 and a P-type region (PW). In addition, the P-type region (PW) is connected to a PW voltage $V_{PW}$. Moreover, the first N-well region (NW1) and the second N-well region (NW2) are separated from each other and formed in a p-substrate in order to achieve complete isolation. To achieving a lower erase line voltage ($V_{EL}$), a thickness of the first portion 362a of the gate oxide layer 362 is thicker than a thickness of the second portion 362b of the gate oxide layer 362. Furthermore, floating gate 36 above the first N-well region (NW1) and the second N-well region (NW2) is a P-doped polysilicon gate 36. Also, the first N-well region (NW1) and the second N-well region (NW2) are two separate N-doped well regions.

FIG. 6D shows the equivalent circuit diagram of the erasable programmable single-poly nonvolatile memory including the first PMOS transistor, the second PMOS transistor, and the erase gate region 68.

Figure 7A:
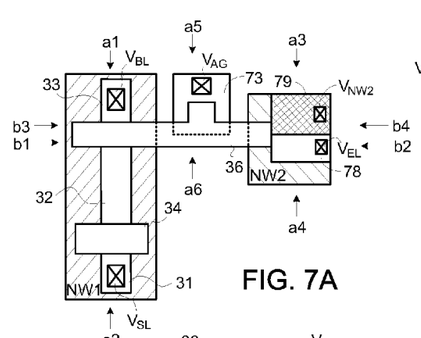
FIGS. 7A-7D schematically illustrate an erasable programmable single-poly nonvolatile memory according to a second embodiment of the present invention.
Figure 7B:
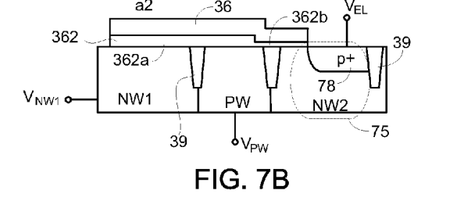
Figures 7C, 7D:
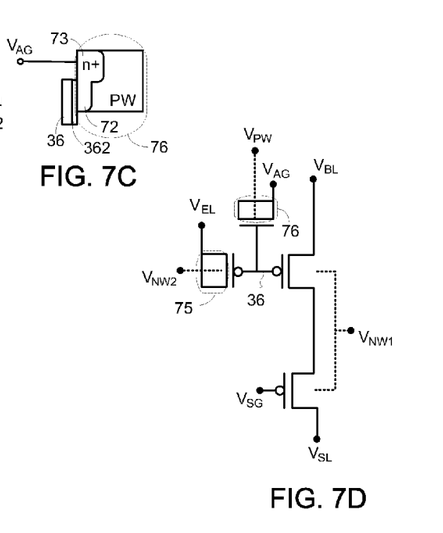

FIGS. 7A-7D schematically illustrate an erasable programmable single-poly nonvolatile memory according to a second embodiment of the present invention. FIG. 7A is a schematic top view illustrating the erasable programmable single-poly nonvolatile memory according to the second embodiment of the present invention. FIG. 7B is a schematic cross-sectional view illustrating the erasable programmable single-poly nonvolatile memory of FIG. 7A and taken along the second direction (b1-b2). FIG. 7C is a schematic cross-sectional view illustrating the erasable programmable single-poly nonvolatile memory of FIG. 7A and taken along the fifth direction (a5-a6). FIG. 7D is a schematic equivalent circuit diagram of the erasable programmable single-poly nonvolatile memory according to the second embodiment of the present invention. The cross-sectional view of the erasable programmable single-poly nonvolatile memory of this embodiment along the first direction (a1-a2) is similar to that of the first embodiment, and is not redundantly shown.

As shown in FIG. 7A, the erasable programmable single-poly nonvolatile memory of the second embodiment comprises two serially-connected p-type metal-oxide semiconductor (PMOS) transistors. These two PMOS transistors are constructed in a first N-well region (NW1). Three p-type doped regions 31, 32 and 33 are formed in the first N-well region (NW1). In addition, two polysilicon gates 34 and 36 are spanned over the areas between the three p-type doped regions 31, 32 and 33.

The first PMOS transistor is used as a select transistor, and the polysilicon gate 34 (also referred as a select gate) of the first PMOS transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor. The polysilicon gate 36 (also referred as a floating gate) is disposed over the second PMOS transistor. The p-type doped region 33 is a second p-type doped region of the second PMOS transistor and connected to a bit line voltage $V_{BL}$. Moreover, the first N-well region (NW1) is connected to a first N-well voltage $V_{NW1}$. The second PMOS transistor is used as a floating gate transistor.

As shown in FIGS. 7A, 7B and 7C, the erasable programmable single-poly nonvolatile memory of the second embodiment comprises an additional PMOS transistor constructed in a second N-well region (NW2) and an NMOS transistor constructed in a P-well region (PW). The PMOS transistor also can be seen as a combination of the floating gate 36, gate oxide layer 362 and an erase gate region 75 and the NMOS transistor also can be seen as a combination of the floating gate 36, the gate oxide layer 362 and an assist gate region 76. In other words, the erase gate region 75 includes the second N-well region (NW2), a p-type doped region 78 and an n-type doped region 49, and the assist gate region 76 includes an n-type doped region 73, an n-lightly doped drain (NLDD) 72, and the P-well region (PW). As shown in FIG. 7C, both the n-type doped region 73 and the n-lightly doped drain (NLDD) 72 are adjacent to each other and are formed in the P-well region (PW). Moreover, as shown in FIG. 7B, the first N-well region (NW1) and the second N-well region (NW2) are completely isolated from each other by an isolation structure 39 and a P-well region (PW). Moreover, the first N-well region (NW1) and the second N-well region (NW2) are separated from each other and formed in a p-substrate in order to achieve complete isolation. Also, the P-well region (PW) can be a P-doped well region and the first N-well region (NW1) and the second N-well region (NW2) can be an N-doped well region.

As shown in FIG. 7A, the floating gate 36 is extended to and is adjacent to the erase gate region 75 and the assist gate region 76. Moreover, the p-type doped region 78 may be considered as a combination of a p-type doped source region and a p-type doped drain region of the PMOS transistor. The p-type doped region 78 is connected to an erase line voltage $V_{EL}$. In addition, the n-type doped region 79 is connected to a second N-well voltage $V_{NW2}$ for the second N-well region (NW2) being connected to the second N-well voltage $V_{NW2}$.

As shown in FIG. 7C, the NMOS transistor is located between the P-well region (PW) and the isolation structure 39. In addition, the n-lightly doped drain (NLDD) region 72 and the n-type doped region 73 are formed in the P-well region (PW). Moreover, the n-lightly doped drain (NLDD) region 72 and the n-type doped region 73 may be considered as a combination of an n-type doped source region and an n-type doped drain region. The n-type doped region 73 is connected to an assist gate voltage $V_{AG}$. In addition, the P-well region (PW) is connected to a P-well voltage $V_{PW}$.

According to the second embodiment of the present invention, a thickness of the first portion 362a of the gate oxide layer 362 is thicker than a thickness of the second portion 362b of the gate oxide layer 362. In the programmed state, the hot carriers (e.g. electrons) are transmitted through a channel region of the floating gate transistor corresponding to the floating gate 36, the first portion 362a of gate oxide layer 362 are tunneled by the hot electrons and then the hot electrons are injected into the floating gate 36. In the erased state, the second portion 362b of gate oxide layer 362 are tunneled by the storage carriers in the floating gate 36 and then the storage carriers are discharged out of the nonvolatile memory through the n-type doped region 38. That is to say, a thickness of the first portion 362a for the hot electrons injected into the floating gate 36 is thicker than a thickness of the second portion 362b for storage carriers ejected from the gate oxide 36.

Furthermore, in a case that the nonvolatile memory is in the programmed state, by applying a specific voltage to the assist gate voltage ($V_{AG}$), the programming voltage and time can be effectively shorten. And, the specific voltage is capable of allowing the floating gate 36 to grab more hot carriers for PMOS channel hot carry mechanism. Under this circumstance, the efficiency of the nonvolatile memory in the programmed state is enhanced.

According to the second embodiment of the present invention, the erase gate region 75 is implemented by using a PMOS transistor and the assist gate region 76 is implemented by using a NMOS transistor. Actually, the erase gate region 75 can be implemented by using a NMOS transistor. Also, the assist gate region 76 can be implemented by using a PMOS transistor.

Figure 8:
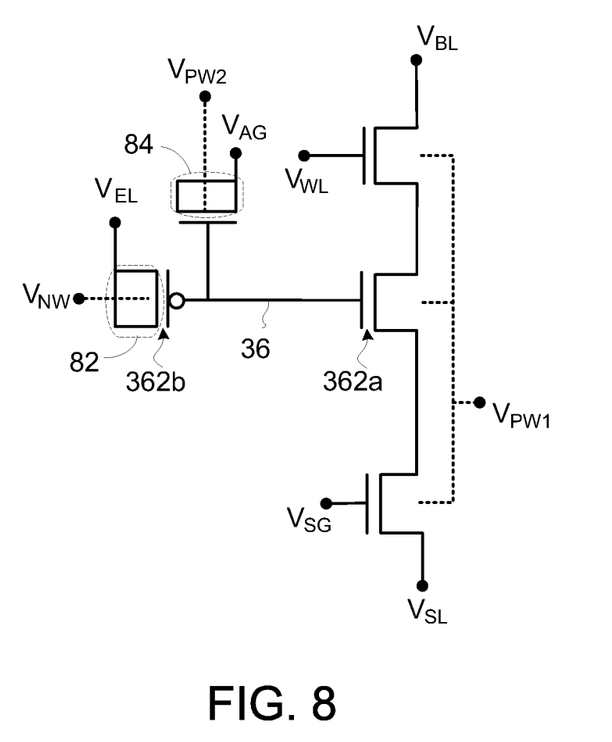
FIG. 8 illustrates a schematic equivalent circuit diagram of the erasable programmable single-poly nonvolatile memory according to the second embodiment and an additional POMS transistor.

Furthermore, an additional PMOS used as a word line transistor can be serially connected to the select transistor and the floating gate transistor of the second embodiment. FIG. 8 illustrates a schematic equivalent circuit diagram of the erasable programmable single-poly nonvolatile memory according to the second embodiment and an additional POMS transistor.

As shown in FIG. 8, a word line transistor is serially connected to the floating gate transistor. A gate of the word line transistor receives a word line voltage ($V_{WL}$), a first terminal of the word line transistor receives a bit line voltage ($V_{BL}$), and a second terminal is connected to the floating gate transistor. Furthermore, the word line transistor, the floating gate transistor, and the select transistor are all constructed in the P-Well region (PW1).

The same way, the erase gate region 82 is implemented by using a PMOS transistor and the assist gate region 84 is implemented by using a NMOS transistor. Actually, the erase gate region can be implemented by using a NMOS transistor. Also, the assist gate region can be implemented by using a PMOS transistor.

Figure 9:
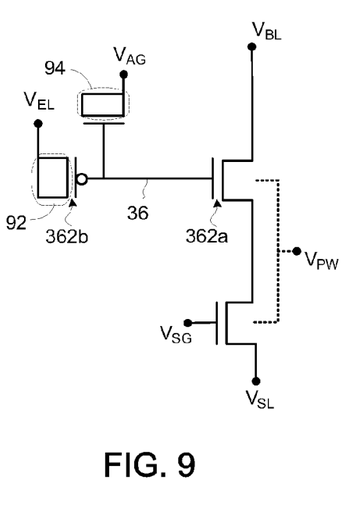
FIG. 9 schematically illustrates an erasable programmable single-poly nonvolatile memory according to a third embodiment of the present invention.

FIG. 9 schematically illustrates an erasable programmable single-poly nonvolatile memory according to a third embodiment of the present invention. And, FIG. 9 only shows the equivalent circuit diagram.

Comparing to the second embodiment, the different is the serially-connected NMOS transistors. That is to say, the select transistor and the floating gate transistor are made of NMOS transistors constructed in the P-well region (PW).

Also, the erase gate region 92 and the assist gate region 94 are implemented by using NMOS transistor or PMOS transistor. According to the third embodiment of the present invention, a thickness of the first portion 362a of the gate oxide layer 362 is thicker than a thickness of the second portion 362b of the gate oxide layer 362. In the programmed state, the hot carriers (e.g. electrons) are transmitted through a channel region of the floating gate transistor corresponding to the floating gate 36, the first portion 362a of gate oxide layer 362 are tunneled by the hot electrons and then the hot electrons are injected into the floating gate 36. In the erased state, the second portion 362b of gate oxide layer 362 is tunneled by the storage carriers in the floating gate 36. And then, the storage carriers are discharged out of the nonvolatile memory.

Furthermore, in a case that the nonvolatile memory is in the programmed state, by applying a specific voltage to the assist gate voltage ($V_{AG}$), the programming voltage and time can be effectively shorten. And, the specific voltage is capable of allowing the floating gate 36 to grab more hot carriers for channel hot carry mechanism. Under this circumstance, the efficiency of the nonvolatile memory in the programmed state is enhanced.

Figure 10:
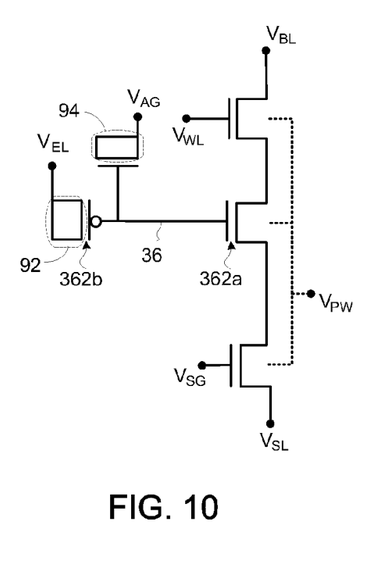
FIG. 10 illustrates a schematic equivalent circuit diagram of the erasable programmable single-poly nonvolatile memory according to the second embodiment and an additional NMOS transistor.

According to the third embodiment of the present invention, an additional NMOS used as a word line transistor can be serially connected to the select transistor and the floating gate transistor. FIG. 10 illustrates a schematic equivalent circuit diagram of the erasable programmable single-poly nonvolatile memory according to the second embodiment and an additional NMOS transistor.

As shown in FIG. 10, a word line transistor is serially connected to the floating gate transistor. A gate of the word line transistor receives a word line voltage ($V_{WL}$), a first terminal of the word line transistor receives a bit line voltage ($V_{BL}$), and a second terminal is connected to the floating gate transistor. Furthermore, the word line transistor, the floating gate transistor, and the select transistor are all constructed in the P-Well region (PW).

From the above description, the erasable programmable single-poly nonvolatile memory of the present invention is capable of decreasing the erase line voltage ($V_{EL}$). That is, by providing a lower erase line voltage $V_{EL}$, storage state of the nonvolatile memory of the present invention is changeable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable single-poly nonvolatile memory, comprising:
   a floating gate transistor comprising a floating gate, a gate oxide layer under the floating gate, and a channel region; and
   an erase gate region, wherein the floating gate is extended to and is adjacent to the erase gate region;
   wherein the gate oxide layer comprises a first portion above the channel region of the floating gate transistor and a second portion above the erase gate region, and a thickness of the first portion of the gate oxide layer is thicker than thickness of the second portion of the gate oxide layer.

2. The erasable programmable single-poly nonvolatile memory as claimed in claim 1 further comprising a select transistor serially-connected to the floating gate transistor, wherein the floating gate transistor and the select transistor are constructed in a first well region and the erase gate region is constructed in a second well region.

3. The erasable programmable single-poly nonvolatile memory as claimed in claim 2, wherein the erase gate region is a tunneling capacitor and the tunneling capacitor is constructed in the second well region.

4. The erasable programmable single-poly nonvolatile memory as claimed in claim 3, wherein the first well region is a P-doped well region or an N-doped well region and the second well region is the P-doped well region or the N-doped well region.

5. The erasable programmable single-poly nonvolatile memory as claimed in claim 1, wherein the erase gate region is composed by a NMOS transistor having the floating gate, a drain and a source, and the drain and the source are connected to each other.

6. The erasable programmable single-poly nonvolatile memory as claimed in claim 1, wherein the erase gate region is composed by a PMOS transistor having the floating gate, a drain and a source, and the drain and the source are connected to each other.

7. The erasable programmable single-poly nonvolatile memory as claimed in claim 1, wherein an injection of carriers into the floating gate is by a channel hot carrier effect and an ejection of carrier out of the floating gate is by a Fowler-Nordhiem effect.

8. The erasable programmable single-poly nonvolatile memory as claimed in claim 1, wherein the floating gate is a P-doped polysilicon gate or an N-doped polysilicon gate.

9. An erasable programmable single-poly nonvolatile memory, comprising:
   a floating gate transistor comprising a floating gate, a gate oxide layer under the floating gate, and a channel region;
   an erase gate region;
   an assist gate region, wherein the floating gate is extended to and is adjacent to the erase gate region and the assist gate region;

wherein the gate oxide layer comprises a first portion above the channel region of the floating gate transistor and a second portion above the erase gate region, and a thickness of the first portion of the gate oxide layer is different from a thickness of the second portion of the gate oxide layer.

10. The erasable programmable single-poly nonvolatile memory as claimed in claim 9 further comprising a select transistor serially-connected to the floating gate transistor, wherein the floating gate transistor and the select transistor are constructed in a first well region, the erase gate region is constructed in a second well region, and the assist gate region is constructed in a third well region.

11. The erasable programmable single-poly nonvolatile memory as claimed in claim 10, wherein the erase gate region is a tunneling capacitor and the tunneling capacitor is constructed in the second well region.

12. The erasable programmable single-poly nonvolatile memory as claimed in claim 11, wherein the first well region is a P-doped well region or an N-doped well region and the second well region is the P-doped well region or the N-doped well region and the third well region is the P-doped well region or the N-doped well region.

13. The erasable programmable single-poly nonvolatile memory as claimed in claim 9, wherein the thickness of the first portion of the gate oxide layer is thicker than the thickness of the second portion of the gate oxide layer.

14. The erasable programmable single-poly nonvolatile memory as claimed in claim 9, wherein the erase gate region or the assist gate region is composed by a NMOS transistor having the floating gate, a drain and a source, and the drain and the source are connected to each other.

15. The erasable programmable single-poly nonvolatile memory as claimed in claim 9, wherein the erase gate region or the assist gate region is composed by a PMOS transistor having the floating gate, a drain and a source, and the drain and the source are connected to each other.

16. The erasable programmable single-poly nonvolatile memory as claimed in claim 9, wherein an injection of carriers into the floating gate is by a channel hot carrier effect and an ejection of carrier out of the floating gate is by a Fowler-Nordhiem effect.

17. The erasable programmable single-poly nonvolatile memory as claimed in claim 9, wherein the floating gate is a P-doped polysilicon gate or an N-doped polysilicon gate.

18. An erasable programmable single-poly nonvolatile memory, comprising:
   a word line transistor;
   a floating gate transistor comprising a floating gate, a gate oxide layer under the floating gate, and a channel region;
   a select gate transistor, wherein the word line transistor, the floating gate transistor and the select gate transistor are serially connected;
   an erase gate region;
   an assist gate region, wherein the floating gate is extended to and is adjacent to the erase gate region and the assist gate region;
   wherein the gate oxide layer comprises a first portion above the channel region of the floating gate transistor and a second portion above the erase gate region, and a thickness of the first portion of the gate oxide layer is different from a thickness of the second portion of the gate oxide layer.

19. The erasable programmable single-poly nonvolatile memory as claimed in claim 18, wherein the word line transistor, the floating gate transistor and the select transistor are constructed in a first well region, the erase gate region is constructed in a second well region, and the assist gate region is constructed in a third well region.

20. The erasable programmable single-poly nonvolatile memory as claimed in claim 19, wherein the erase gate region is a tunneling capacitor and the tunneling capacitor is constructed in the second well region.

21. The erasable programmable single-poly nonvolatile memory as claimed in claim 19, wherein the first well region is a P-doped well region or an N-doped well region and the second well region is the P-doped well region or the N-doped well region and the third well region is the P-doped well region or the N-doped well region.

22. The erasable programmable single-poly nonvolatile memory as claimed in claim 18, wherein the thickness of the first portion of the gate oxide layer is thicker than the thickness of the second portion of the gate oxide layer.

23. The erasable programmable single-poly nonvolatile memory as claimed in claim 18, wherein the erase gate region or the assist gate region is composed by a NMOS transistor having the floating gate, a drain and a source, and the drain and the source are connected to each other.

24. The erasable programmable single-poly nonvolatile memory as claimed in claim 18, wherein the erase gate region or the assist gate region is composed by a NMOS transistor having the floating gate, a drain and a source, and the drain and the source are connected to each other.

25. The erasable programmable single-poly nonvolatile memory as claimed in claim 18, wherein an injection of carriers into the floating gate is by a channel hot carrier effect and an ejection of carrier out of the floating gate is by a Fowler-Nordhiem effect.

26. The erasable programmable single-poly nonvolatile memory as claimed in claim 18, wherein the floating gate is a P-doped polysilicon gate or an N-doped polysilicon gate.

* * * * *